United States Patent [19]

Tu

[11] Patent Number: 4,728,626
[45] Date of Patent: Mar. 1, 1988

[54] METHOD FOR MAKING PLANAR 3D HETEREPITAXIAL SEMICONDUCTOR STRUCTURES WITH BURIED EPITAXIAL SILICIDES

[75] Inventor: King-Ning Tu, Chappaqua, N.Y.

[73] Assignee: International Business Machines Corporation, Armonk, N.Y.

[21] Appl. No.: 799,043

[22] Filed: Nov. 18, 1985

[51] Int. Cl.⁴ .................... H01L 29/48; H01L 23/54
[52] U.S. Cl. ..................... 437/126; 437/130; 437/133; 437/202; 437/200; 437/201; 437/228; 437/245; 437/915; 437/965; 437/973; 437/936; 437/208; 427/53.1; 427/51; 357/65; 357/60; 357/61
[58] Field of Search ............. 29/589, 590, 591, 576 E; 148/DIG. 140, DIG. 147, DIG. 19, DIG. 20, 175; 357/65; 427/88

[56] References Cited

U.S. PATENT DOCUMENTS

| 3,938,243 | 2/1976 | Rosvold | 29/578 |
| 4,446,476 | 5/1984 | Isaac et al. | 357/67 |
| 4,488,166 | 12/1984 | Lehrer | 357/71 |
| 4,492,971 | 1/1985 | Bean et al. | 357/15 |
| 4,529,997 | 7/1985 | Jay et al. | 357/68 |

OTHER PUBLICATIONS

Japan J. Appl. Phys. Suppl. 2, Pt. 1, 1974, "Epitaxial Growth of Nickel Silicide NiSi₂ on Silicon", by K. N. Tu et al., PP. 669–672.
Thin Solid Films, 93(1982), "Epitaxial Silicides", by R. T. Tung et al., pp. 77–90.

Primary Examiner—Brian E. Hearn
Assistant Examiner—William Bunch
Attorney, Agent, or Firm—Jackson E. Stanland

[57] ABSTRACT

A 3D epitaxial structure is described in which metal compounds are formed in a semiconductor layer, the metal compounds being epitaxial with the semiconductor layer and having a top surface which is planar with the top surface of the semiconductor layer. Onto this another layer can be epitaxially grown, such as an additional semiconductor layer. The technique for forming such a structure utilizes a starting material for metal compound formation which leaves a residue that is preferentially etched in order to preserve the embedded metal compound and to leave a substantially planar surface comprising the metal compound epitaxial regions and the unreacted surface regions of the semiconductor layer.

24 Claims, 12 Drawing Figures

METHOD FOR MAKING PLANAR 3D HETEREPITAXIAL SEMICONDUCTOR STRUCTURES WITH BURIED EPITAXIAL SILICIDES

FIELD OF THE INVENTION

This invention relates to epitaxial 3D semiconductor structures and methods for making the same, and more particularly to planar 3D epitaxial structures including buried epitaxial patterns and device quality semiconductor layers.

BACKGROUND ART

Semiconductor device structures have been made with increased storage and logic density, primarily by reducing the lateral dimensions of the devices and conducting patterns which form the circuits. However, there is a limit to how small devices and patterns can be made, and how closely the devices can be packed. In particular, heat dissipation may be a limiting factor in the ultimate device and circuit density that can be achieved. IIn order to avoid the constraints related to decreasing the size of devices and packing them more closely together, scientists have been considering the possibility of three dimensional (3D) structures wherein the storage or logic capacity of a structure can be increased by utilizing a vertical dimension, in addition to lateral dimensions. To accomplish these ends, scientists have considered many different types of semiconductor homostructures and heterostructures, i.e., combinations of layers of different semiconductor materials in a single composite crystal. Structures of this type would provide an increased number of selection criteria to device designers, including electrical properties which may or may not be present in structures utilizing only two dimensions.

Semiconductor 3D heterostructures or homostructures having perfection suitable for state of the art devices are extremely difficult to produce. Many approaches have been utilized, including the combination of III-V materials, or the combination of II-VI semiconductors. These III-V or II-VI semiconductors have been proposed in combination with ternery materials in the same systems including, for example, GaAs and GaAlAs. Layers having slightly different amounts of the ternery addition can be compositionally graded to reduce the effect of the top positional discontinuity. These structures are used in optoelectronic devices, and have been proposed for other uses.

An example of a heterostructure incorporating a metal layer is found in U.S. Pat. No. 4,492,971. In this reference, a three layer semiconductor heterostructure is described which incorporates a metal silicide layer. A substrate comprised of a single crystal of silicon has an overlying layer of a single crystal metal silicide. This metal silicide has a crystalline perfection very similar to that of the underlying single crystal silicon. Because of this, an overlying layer of silicon can be formed on the metal silicide layer in order to complete the 3-dimensional structure. Also, the overlying layer can be a material other than silicon as long as that material is one which is capable of growing epitaxially on the metal silicide.

The 3-dimensional structure illustrated in the aforementioned patent is one which is comprised of three distinct layers. It is not possible using the techniques of that reference to have the silicide layer formed within the underlying single crystal semiconductor layer in a manner to provide a planar top surface including silicide regions and the single crystal semiconductor. This is particularly true if the metal silicide is patterned, rather than being laterally coextensive with the underlying silicon layer. This lack of planarization when a patterned silicide layer is formed will occur regardless of the technique used to form the metal silicide layer. Thus, the structure of this reference always includes three distinct layers, one of which is the metal silicide layer.

It would be desireable to form a 3-dimensional semiconductor structure in which the surface of the metal silicide regions is coextensive with the surface of the single crystal silicon layer, i.e., one in which the metal silicide regions are embedded in the single crystal silicon layer in a manner such that a planar top surface is provided. In order to have complete planarization so that the subsequently formed overlying semiconductor layer is perfectly planar, there can be no step, or surface irregularity, in the areas where the metal silicide is formed. Such total planarization cannot be achieved using the technique of U.S. Pat. No. 4,492,971.

Whenever a layer of a silicide-forming metal is deposited on a silicon layer and subsequently annealed to form a metal silicide, the metal silicide will grow both into the silicon layer and out from the silicon layer. If the out-growing, or protruding, portion of the metal silicide is to be removed in order to leave a planar surface, this can be achieved only by disadvantageous mechanical-type polishing steps. Any type of reactive etching, including reactive ion etching and chemical etching, will attack and remove both the protruding silicide region and the embedded silicide region. The net result is that a totally planar surface cannot be provided.

Ion implantation is also not a suitable technique for producing a buried epitaxial region that is planar with the semiconductor in which it is embedded. Using ion implantation, only very thin ($\approx 50$ angstroms) epitaxial regions can be produced without requiring implantation over many days. Typically ion implantation is used when the implanted region is to be no more than about 1-10 monolayers deep.

Accordingly, it is a primary object of the present invention to provide a 3-dimensional semiconductor structure having embedded compounds therein which are epitaxial with both an underlying semiconductor layer and an overlying semiconductor layer.

It is another object of the present invention to provide a technique for producing 3-dimensional epitaxial semiconductor structures which are completely planar and include buried conductive regions in at least one of the semiconductor layers.

It is another object of this invention to provide a structure and technique for providing that structure, wherein the structure includes at least two epitaxial semiconductor layers which have located between them regions of conductive metal compounds of at least one of the semiconductors, where the top surface of the metal compound regions and the top surface of one of the semiconductor layers are substantially planar.

It is another object of the present invention to provide an epitaxial 3-dimensional structure comprised of two single crystal semiconductor layers wherein one of said semiconductor layers is single crystal silicon having embedded regions of a metal silicide therein, the top surface of the metal silicide regions being planar with the top surface of the silicon semiconductor layer in which the metal silicide regions are embedded.

It is another object of the present invention to provide a 3-dimensional epitaxial single crystal structure and method for making the structure wherein the same or different semiconductor layers can be used, there being a buried conductive epitaxial region between the two semiconductor layers.

It is another object of the present invention to provide a technique for making an epitaxial, 3-dimensional structure in which a first layer of single crystal silicon has embedded therein metal silicide regions whose top surface is planar with the top surface of the single crystal silicon, and an overlying layer of a material which is epitaxial with both the underlying silicon layer and the metal silicide regions.

DISCLOSURE OF THE INVENTION

This invention relates to 3-dimensional structures utilizing single crystal epitaxial materials in which selected compounds (such as electrically conductive materials) can be epitaxially produced in a semiconductor single crystal layer. This allows greatly increased device and circuit density and can also lead to types of device structures other than the conventional bipolar and MOSFET device structures currently in use. The 3D structure can be comprised of a first layer of single crystal semiconductor material, such as silicon, having embedded therein conducting lines whose top surface is planar and coextensive with the top surface of the single crystal semiconductor layer. This forms a planar substrate on which another layer can be epitaxially formed. This other layer can be comprised of the same material as the first semiconductor layer, or a different material. In a preferred example, the first single crystal semiconductor material is silicon, the embedded compounds are metal silicide conductors epitaxially formed in the silicon layer, and the top layer is also epitaxial, single crystal silicon. A plurality of layers can be built up in this manner to provide a 3-dimensional structure comprised of, for example, alternating layers of single crystal semiconductor material and metal silicide conductor lines.

The technique by which the 3-dimensional structure is formed provides complete planarization, so that the conductors are embedded in the underlying single crystal semiconductor layer, having a top surface which is perfectly planar with the top surface of the semiconductor layer. This planar structure is suitable for the subsequent deposition of an epitaxial, single crystal layer thereon. In the practice of this invention, the embedded conductors are formed by a technique that uses starting materials additional to those which form the embedded conductor. The residue of these additional materials can be etched reactively wherein the embedded conductor is an etch stop. Thus, any portion of the starting materials which protrudes from the surface of the semiconductor crystal in which the epitaxial conductors are embedded can be etched without etching into the embedded conductors. This selective etching stops at the surface of the embedded conductors, which surface is planar with the surface of the semiconductor layer in which the conductors are embedded, thereby leaving a planar surface capable of epitaxial, single crystal growth thereon.

These and other objects, features and advantages will be apparent from the following more particular description of the preferred embodiments.

BEST MODE FOR CARRYING OUT THE INVENTION

Figure 1:
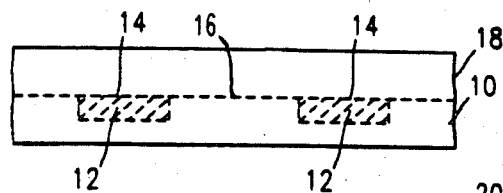
FIG. 1 is a side elevational view of a 3D structure including embedded conductive regions which have a top surface that is planar with the single crystal layer in which they are embedded.

In the practice of this invention, it is desired to provide a planar, 3D epitaxial semiconductor structure having embedded epitaxial regions therein, such as conductors, where the top surface of the embedded (conductive) regions is planar with the semiconductor layer in which they are embedded. This structure is illustrated in FIG. 1, where first layer 10 is a single crystal semiconductor layer having embedded regions 12 therein, that are epitaxial with semiconductor 10, and are single crystalline material. The top surface 14 of regions 12 is planar with the top surface 16 of layer 10. Top layer 18 of this structure is an epitaxially formed, single crystal layer, which can be comprised of the same material as layer 10. Further, layer 18 can be comprised of a different material as long as it can be formed epitaxially on semiconductor layer 10 and regions 12.

As an example of materials that can comprise the various layers 10, 12, and 18, layer 10 can be a single crystal silicon layer, while regions 12 can be conductive metal silicides that are epitaxial with silicon layer 10. Overlying single crystal layer 18 can also be an epitaxial silicon layer, or another material which is epitaxial with layers 10 and 12. Such other material can be, for example, $CaF_2$. Thus, the 3D structure of FIG. 1 can be either homoepitaxy or heteroepitaxy in nature.

As will become more apparent to those of skill in the art, the principles of the present invention can be extended beyond the materials which will be set forth as illustrative examples. For example, while silicon-based materials are commercially the most interesting at this time, other semiconductor materials such as Ge can be utilized in the practice of this invention. Further, materials such as GaAs and other compounds including ternery compounds can also be used as long as epitaxial, single crystal growth having a planar interface is achieved.

Figure 2A:
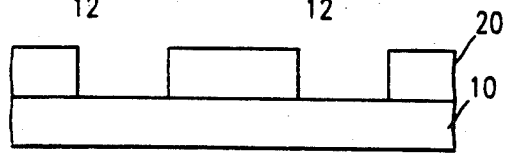
FIGS. 2A–2F are side elevational views which illustrate a method by which the planar, 3D structure of FIG. 1 is made.

FIGS. 2A–2F illustrate the inventive method wherein the planar, single crystal structure of FIG. 1 can be achieved. The key to this method is the choice of starting materials forming the epitaxial compound regions 12, so that a precise etch-stop is formed to ensure that the top surface 14 of regions 12 is planar with the top surface 16 of the semiconductor layer 10. in more detail, FIG. 2A shows the single crystal semiconductor layer 10, having thereon a patterned resist layer 20. Resist layer 20 is any type of masking layer used to provide selective location of the materials which will later be used to form the conductive regions 12. To further aid in illustration, FIGS. 2A–2F will be explained by reference to a silicon-based embodiment wherein layer 10 is a single crystal layer of silicon, and the regions 12 are electrically conductive metal silicides.

Figure 2B:
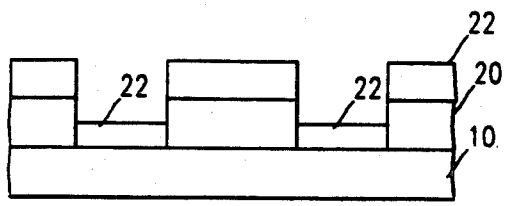

In FIG. 2B, a metallic alloy layer 22 is deposited on the resist layer 20 and on the exposed regions of silicon layer 10. Layer 22 is comprised of a metal alloy (for example, $A_xB_y$) which is compositionally homogeneous and has a thickness chosen in terms of the amounts of metals A and B and the thickness of the metal regions 12 to be formed in semiconductor layer 10. Alloy layer 22 can easily be formed by codeposition using either evaporation or sputtering.

Metal A is chosen to be one which will react with silicon semiconductor layer 10 to form a metal silicide at certain annealing conditions of time, temperature, and ambient. The metal silicide phase which is formed is chosen to be one which will form an epitaxial interface with silicon layer 10. Such epitaxial phases are well known in the art and can be determined by reference to binary phase diagrams of various metals-silicon systems. These phase diagrams also will give the temperatures at which the various phases will form. For example, reference is made to K.N. Tu et al, Proc. Sixth International Vacuum Congress, 1974, Japan, J. Appl. Phys. Suppl. 2, Pt. 1, 1974, page 669 and R.T. Tung et al, Thin Solid Films, 93 (1982), 77–90.

Metal B is chosen to be one which will not easily form a silicide with silicon layer 10 or, if such a silicide is formed, it will not be formed at the annealing times and temperatures chosen for formation of the metal A silicide.

Figure 2C:
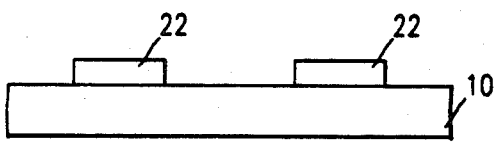

In FIG. 2C, the resist layer 20 and overlying metal alloy layer 22 are removed, leaving alloy layer 22 only in those regions beneath which it is desired to form the metal silicide regions 12.

Figure 2D:
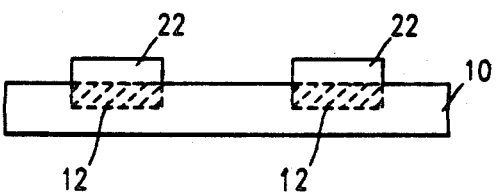

FIG. 2D illustrates the metal silicide formation to create the conductive regions 12. The structure of FIG. 2C is annealed at a specified time and temperature to produce a metal silicide phase which is epitaxial with the silicon layer 10, using metal A. During annealing, metal A is the dominant diffusing species so that A atoms diffuse into silicon layer 10 and there is an exchange of fluxes of metal A and Si. When the annealing is completed, most of metal A is depleted from the alloy layer 22 so that the alloy layer 22 left on layer 10 (FIG. 2D) is a layer of metal B containing some Si and residue of metal A.

Figure 2E:
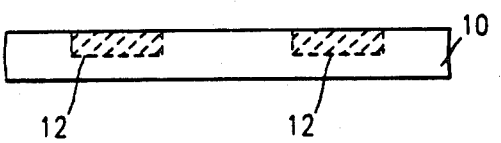
Figure 2F:
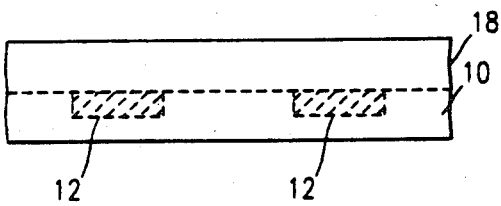

An important feature of the present invention is that the nature of the layer 22 remaining on the surface of single crystal 10 after metal silicide formation is such that it can be removed by a reactive etching technique wherein the top surface of metal silicide region 12 forms an etch-stop. In this manner, a perfectly planar top surface can be formed, as illustrated in FIG. 2E. Thus, one of the criteria used to select metal B is that it can be etched at a different rate than metal silicide 12, or more specifically that the remaining portion 22 (FIG. 2D) can be selectively etched in a manner so as not to etch underlying metal silicide region 12. It has been discovered that this will provide a planar top surface onto which an epitaxial layer 18 can be formed. This is illustrated in FIG. 2F, where epitaxial layer 18 can be, for example, another single crystal layer of silicon.

If layer 22 were comprised only of metal A, the metal silicide so formed would be formed both within silicon layer 10 and on the surface of silicon layer 10. This would create a step which would interfere with complete planarization, unless that step could somehow be removed to leave a planar top surface, as shown in FIG. 2E. However, since in that situation both the embedded and protruding metal silicide would be the same material, selective etching would not be possible. Thus, any type of reactive etching used to remove the protruding metal silicide portion would also attack the embedded metal silicide portion, thereby rendering impossible the provision of a planar top surface. However, because the composition of the remaining portion of layer 22 after silicide formation is different than the composition of the metal silicide, selective etching by conventional techniques is possible. These techniques include chemical etching, dry etching or sputtering, and reactive ion etching. In contrast with this for the situation in which the starting material of layer 22 includes substantially only metal A, planarization can only be achieved by a mechanical polishing technique which would have to be precisely controlled in order to have any chance of substantial planarization. Such a polishing technique would also reduce the quality of the surface that is formed, which would render impossible the epitaxial growth of layer 18.

In the selection of the starting material of layer 22, certain criteria have already been mentioned. The following section will provide more detail of the choices of materials A and B, as well as their relative amounts. The general guideline is that metal A should form a metal silicide with silicon layer 10 which is epitaxial therewith and can be formed at annealing conditions under which metal B will not form a silicide. Further, the composition of the remaining portions of layer 22 after silicide formation must be such that selective etching can be achieved. Within this general context, the selection criteria are the following:

1. Element A must form a compound phase which is epitaxial with the underlying semiconductor layer 10, the compound phase preferably being easily formed. In the case of a silicon underlying layer, the compound preferably is a metal silicide.

2. The compound which is formed must be eiptaxial with the underlying semiconductor layer in order to provide single crystal, epitaxial growth and a suitable substrate for the subsequent growth of the overlying layer 18.

3. Material B must not form a compound phase, such as a silicide, or, if a compound phase is formed with B, that phase must be formed at different conditions (for example, at a higher temperature) than the compound formed between metal A and the underlying semiconductor. For example, if both metals A and B can form silicide phases, the metal silicide phase formed by A must occur at a lower temperature than that formed by metal B. This ensures that only the desired epitaxial silicide phase will be formed and that the remainder of layer 22 after silicide formation can be etched away.

4. Material B preferably has a strong reaction with native oxides in order to clean the original surface of underlying semiconductor layer 10 prior to and during silicide formation. This will ensure that any blocking barrier to the transport of metal A into the underlying semiconductor layer 10 will be removed, in order to allow complete reaction of metal A and underlying semiconductor layer 10. As an example, metal B can be erbium (Er) if semiconductor layer 10 is silicon. Er oxidizes very easily and will help remove any barriers to the diffusion of metal A into underlying silicon layer 10.

5. The residue of starting material 22 that is left after the conductive regions 12 are formed must be capable of being selectively etched without etching the underlying epitaxial regions 12. For example, in the case of metal silicide conductive regions 12, Er was mentioned as being suitable for metal B. This metal and any remaining portions of Si and metal A can be easily preferentially etched using chemical or reactive ion etching techniques well known in the art.

6. In the choice of starting materials A and B, metal A must be able to decouple from material B in order to diffuse from the alloy 22 to the underlying semiconductor surface. This, however, is not a limiting factor, as the temperature for annealing can be increased in order to decouple A from B so that it will diffuse into the underlying semiconductor layer 10. In the example of silicon underlayer 10 and silicide regions 12, representative examples for metal A include Pt, Pd, Ni, Cr, Mo, W, V, Nb, Ta, and Co. To a lesser extent, Ti can also be used since $TiSi_2$ does have some epitaxy with (111)Si. However, since the lattice match is not as good, some defects may result and the thickness of the epitaxial $TiSi_2$ will be limited to about 100 angstroms, or less. Metal B can be a rare earth metal (such as Er, Gd, Dy, ...) or a refractory metal.

7. Materials A and B should not form a strong compound when heated, in order to allow easy decoupling of metal A to form a compound with underlying semiconductor layer 10. Materials A, B preferentially form a homogeneous amorphous alloy or, less preferentially, a weak compound. In order to ensure that this will be the situation, the amounts of materials A and B can be varied somewhat in order to ensure that non-stoichiometric proportions are present in the starting alloy 22. As noted previously, with co-sputtering and co-evaporation techniques to form starting material 22, homogeneous amorphous alloys can readily be formed.

8. The proportionate amounts of materials A and B in the starting alloy layer 22 are chosen to provide the desired thickness of epitaxial compound 12. Generally, however, it is preferable that the amount of metal A which is to form a compound with underlying semiconductor 10 not exceed about 80% of the starting alloy $A_xB_y$. If there is too much metal A present, the residue which is left after compound formation will be too similar to the epitaxial compound regions 12, to enable preferential etching. However, the exact amount of metal A can be somewhat less than that generally used in order to provide the desired conductive compound, where the amount can be approximately 10% below that which would normally be used. For example, in the case of Pd as metal A and Er as metal B, an alloy of $Pd_{70}Er_{30}$ is generally used in order to create the epitaxial silicon phase $Pd_2Si$ which grows epitaxially on (111) silicon. However, the starting alloy can be reduced in Pd content to approximately 60% Pd and still be suitable in accordance with the goals of the present invention. An example of a situation where the amount of metal A is reduced below that which is generally to be used is in a situation where the composition of starting alloy $A_xB_y$ is not as compositionally homogeneous as would be desired. By using less of the compound-forming metal A, the likelihood of a protuberance of the epitaxial compound regions 12 above the surface of semiconductor layer 10 will be minimized.

9. The starting alloy is not limited to binary alloys. Ternary alloys or alloys containing dopants can also be used. For example, a small amount of Si can be added to the starting alloy in order to minimize the drive for Si atoms to enter starting alloy 22 from the underlying Si layer 10. Another reason for including an additional element is to make the alloy more stable, i.e., to reduce the tendancy of the starting materials to themselves form a compound, or to provide a residue after annealing which is more easily etched. Those of skill in the art will readily appreciate that various combinations can be used within the guidelines of the present invention.

10. The thickness of the layer 22 of starting material is chosen in accordance with the desired depth of the epitaxial conductive regions 12 that are to be formed in underlying semiconductor layer 10. These considerations are well known to those of skill in the art, and will not be described further at this time. Since the residue of starting layer 22 after annealing to form the regions 12 can be preferentially etched to leave a planar, epitaxial interface, the thickness of starting layer 22 can be chosen primarily in accordance with the desired thickness of the epitaxial regions 12. This allows the designer considerable flexibility in providing the 3D structure. Further, because the starting layer 22 can be patterned in accordance with any desired configuration, the same pattern of underlying conductive regions 12 will be formed. This allows the possibility of interconnections in the x-y plane, as well as in a direction normal to the x-y plane. It also allows the possibility of devices wherein the conductive epitaxial regions provide functions such as contacts and gating electrodes.

The following examples will illustrate the present invention, especially where the underlying semiconductor layer is a silicon layer. As noted previously, conductive epitaxial regions comprising metal silicides are particularly favorable. Suitable metals A for the formation of epitaxial conductive silicides include Pt, Pd, Ni, Cr, Mo, W, V, Nb, Ta, and Co. All of these metals can form epitaxial metal silicides with silicon. For example, $NiSi_2$ and $CoSi_2$ grow epitaxially on (100) silicon and (111) silicon. $Pd_2Si$ will grow epitaxially on (111) silicon while small crystals of $Pd_2Si$ and $PtSi$ can grow epitaxially on (100) Si. $CrSi_2$, $MoSi_2$, $WSi_2$, $VSi_2$, $NbSi_2$, and $TaSi_2$, are all capable of epitaxial growth on (111) silicon. As noted, $TiSi_2$ is not perfectly lattice matched with Si, and can't be epitaxially grown to thicknesses greater than about 100 angstroms, without the introduction of defects. The same is true for the metal silicides $FeSi_2$ and $ZrSi_2$. The composition of metal A for these examples can vary from about 20 to about 80 atomic %, while the temperature and time of annealing will vary from about 200° C. to about 800° C., and from about 30 minutes to about 2 hours, depending upon the starting alloy 22 and its thickness.

A suitable example is that in which an underlying layer of silicon is to have epitaxial regions of Pd silicide formed therein, the top surfaces of the Pd silicide and unreacted silicon being planar. The starting material can be $Pd_{70}Er_{30}$, where material B is Er. Annealing of this alloy on Si (100) at approximately 350° C. for 1 hour will produce epitaxial regions 12 of $Pd_2Si$. Tests of regions 12 show epitaxial growth as evidenced by a regular moire pattern, the edges of the epitaxial regions having a preferred orientation along <100> directions of Si.

In the foregoing example, the residue of starting material 22 is primarily comprised of Er, with some lesser amounts of Si and Pd. This residue is preferentially removed by chemical etching, dry etching, or sputtering in order to obtain the planar surface exposing the epitaxial Pd silicide phase $Pd_2Si$. After this, a further epitaxial layer 18 of, for example, silicon or another material such as $CaF_2$, can be grown.

As another example, the starting material $A_xB_y$ can be a Ni-Er alloy having compositional proportions of $Ni_{33}Er_{67}$. Annealing for the proper time and temperature will yield the metal silicide phase $NiSi_2$, which is an epitaxial phase with silicon. After preferential etching, a planar surface of the unreacted silicon layer and the epitaxial nickel silicon phase is obtained. The top-most layer 18 is then epitaxially grown on this substrate.

In the practice of the present invention, it will be readily apparent that additional epitaxial layers can be formed on the overlying layer 18.

In the further practice of this invention, the compound formation step for producing the epitaxial regions 12 can be controlled at will by varying the starting alloy composition of layer 22, as well as by varying the thickness of this layer and the annealing conditions. Further, a pattern of the epitaxial regions 12 can be made by using a scanning or patterned energetic beam to locally heat the starting alloy and the underlying semiconductor layer 10, if starting material 10 is a continuous layer (FIGS. 3A-3E), rather than the patterned layer illustrated in FIGS. 2A-2F. Of course, this removes the necessity of the patterned masking, or resist, layer 20, which is shown in FIG. 2A. Any suitable technique is within the scope of this invention, where the invention is directed to the formation of a compound epitaxial region 12 from a starting material whose residue after compound formation can be removed to allow a planar surface of the compound and the unreacted semiconductor layer 10.

An alternative approach for providing the 3D epitaxial structure of FIG. 1 is illustrated by FIGS. 3A-3E. In this alternative method, localized heating is used to form the pattern of epitaxial compound regions, starting from an unpatterned alloy layer. For each of understanding, the same reference numerals will be used in FIGS. 3A-3E as were used for corresponding layers in the embodiment of FIGS. 2A-2F.

The materials used for the various layers in FIGS. 3A-3E are the same as those in FIGS. 2A-2F, and will not be described in detail in the following description.

Figure 3A:
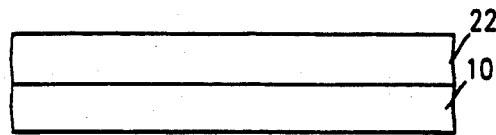
FIGS. 3A–3E are side elevational views which represent an alternative method for providing an epitaxial, 3D structure in accordance with the present invention.
Figure 3B:
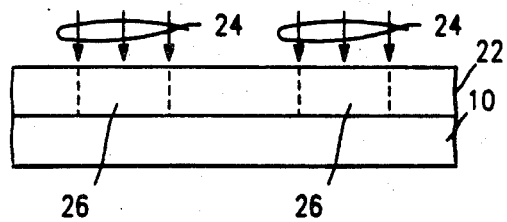
Figure 3C:
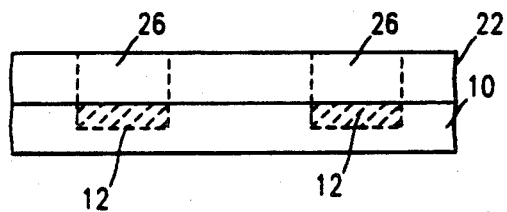
Figure 3D:
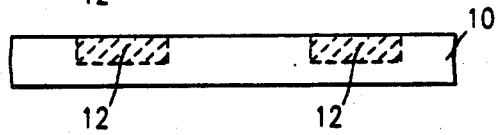

In FIG. 3A, alloy layer 22 is deposited over the entire top surface of single crystal layer 10, rather than being patterned as shown in FIGS. 2B, 2C. To form patterns of epitaxial compound regions 12, localized heating is used as shown in FIG. 2B. Here, a beam 24 of energetic particles, such as photons, is used to heat localized regions 26 of layer 22. This heating step will form localized epitaxial compound regions 12, as shown in FIG. 3C.

After epitaxial compound regions 12 are formed, the residue of layer 22, including depleted localized regions 26, is selectively removed, using the techniques described with respect to FIG. 2E. Again, the dissimilar material in epitaxial regions 12 forms an etch stop, leaving a substrate 10 having a planar top surface and embedded epitaxial regions 12 therein.

Figure 3E:
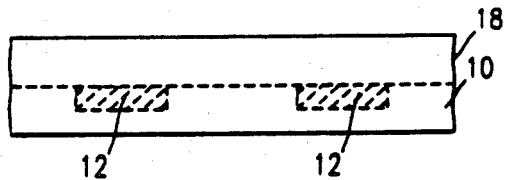

In FIG. 3E, a single crystal top layer 18 is epitaxially grown on the unreacted portions of layer 10 and on the epitaxial compound regions 12.

While the invention has been described with respect to particular embodiments thereof, it will be apparent to those of skill in the art that variations can be made therein without departing from the spirit and scope of the present invention. Examples of such variations have been described hereinabove, relating to both the compositions of the starting materials in layer 22 and the semiconductor layers as well as the particular processing steps that are utilized. Still further, it will be apparent to those of skill in the art that all types of device and circuit configurations can be made using the attributes of this planar, epitaxial 3D structure.

Having thus described our invention, what we claim as new and desire to secure by Letters Patent is:

1. A method for forming a 3D, epitaxial structure, comprising the steps of:

providing a first layer of a single crystal semiconductor material, forming a layer comprised of a composition including at least elements A and B on at least a portion of said first layer, element A being capable of forming a compound with said semiconductor material that is epitaxial with said semiconductor material, element B being chosen as one which does not readily form a compound with said semiconductor material at the temperatures and times used in a heating step to form said epitaxial compound of element A and said semiconductor, heating said composition and said first said semiconductor layer to form said epitaxial compound in said semiconductor layer, the residue of said composition after said heating step being capable of being etched without undue etching of said epitaxial compound, said epitaxial compound forming an etch stop, removing said residue by etching to the surface of said epitaxial compound, thereby producing a planar surface comprised of the top surface of said epitaxial compound and the unreacted surface portion of said first layer of semiconductor material, and epitaxially forming a top layer of single crystal material over said epitaxial compound and said first layer of semiconductor material.

2. The method of claim 1, where said first layer is comprised of silicon and element A is a metal, the epitaxial compound formed by said heating step being a metal silicide compound that is epitaxial with said silicon first layer.

3. The method of claim 2, where said element A is selected from the group consisting of Pd, Pt, Ni, Co, Cr, Mo, W, V, Nb, Ta and Ti.

4. The method of claim 3, where said epitaxial top layer is silicon.

5. The method of claim 2, where said composition is a metal alloy.

6. The method of claim 5, where the percentage of element A in said composition is in the range of about 20-80 atomic %.

7. The method of claim 5, where said composition includes at least one additional element.

8. The method of claim 5, where said top epitaxial layer is silicon.

9. A method for forming a 3D, epitaxial structure including the steps of:

depositing onto at least a portion of a single crystal substrate a layer having a composition including at least two elements capable of being decoupled from one another when heated at given conditions of temperature and time, one of said elements then forming a compound with said substrate which is epitaxial therewith and embedded therein while the other elements in said composition does not readily form a compound with said substrate when heated at said given conditions of temperature and time, heating said layer at said given conditions of temperature and time to decouple said elements and to form said epitaxial compound embedded in the surface of said substrate, said compound having a top surface which is substantially planar with the top surface of said substrate, the remainder of said composition left on the surface of said substrate after said heating step being removeable without substantially removing said epitaxial compound, removing said remainder of said composition by reactively etching it, said removal continuing until the surface of said epitaxial compound is exposed, said compound acting as an etch stop to leave a substrate having an embedded epitaxial compound region therein and a planar top surface, and epitaxially growing a single crystal top layer onto at least said epitaxial compound region.

10. The method of claim 9, where said top layer is epitaxially grown over at least a portion of said substrate surface including both said epitaxial compound region and an unreacted surface portion of said substrate.

11. The method of claim 9, where said substrate is silicon, said epitaxial compound is a silicide, and said top layer is a single crystal epitaxially grown layer of silicon.

12. The method of claim 11, where said composition is a metal alloy and said epitaxial compound is a metal silicide.

13. The method of claim 12, where the epitaxial compound forming element in said composition is selected from the group consisting of Pd, Pt, Ni, Cr, Mo, W, V, Nb, Ta, Ti, and Co, and at least one other element in said composition is selected from the group consisting of refractory metals or rare earth metals.

14. The method of claim 12, where said composition further includes silicon.

15. The method of claim 12, where the element in said composition forming said metal silicide is present in said composition in an amount between about 20 and 80%.

16. The method of claim 15, where said top layer is epitaxially grown over substantially the entire substrate surface.

17. The method of claim 12, where said non-silicide forming element in said composition has a strong afinity for oxygen.

18. The method of claim 12, where said elements in said composition are chosen such that a strong compound of said elements will not be formed during said heating step.

19. The method of claim 18, where said composition is substantially compositionally homogeneous.

20. The method of claim 11, where said non-silicide forming element is Er.

21. The method of claim 9, where said epitaxial compound is electrically conductive.

22. A method for making a 3D, epitaxial structure, comprising the steps of:

depositing a starting layer onto a single crystal semiconductor layer, said starting layer including at least two elements, one of which can react with said semiconductor to produce a compound which is epitaxial therewith and embedded in said semiconductor, forming said epitaxial compound embedded in said semiconductor, said compound having a top surface which is substantially planar with the top surface of said semiconductor layer, there being a residue of said starting layer left on said epitaxial compound after said compound is formed, removing said residue and leaving said embedded compound whose top surface is substantially planar with the top surface of said semiconductor layer, and epitaxially forming a single crystal top layer on said planar surface.

23. The method of claim 22, wherein said semiconductor layer is silicon, and said epitaxial compound is a metal silicide.

24. The method of claim 23, where said top layer is Si.

* * * * *